United States Patent
Matsumoto et al.

(10) Patent No.: US 11,322,422 B2
(45) Date of Patent: May 3, 2022

(54) VEHICLE POWER CONVERSION DEVICE

(71) Applicant: Mitsubishi Electric Corporation, Tokyo (JP)

(72) Inventors: Yuta Matsumoto, Tokyo (JP); Hirokazu Takabayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/257,180

(22) PCT Filed: Jun. 24, 2019

(86) PCT No.: PCT/JP2019/024880
§ 371 (c)(1),
(2) Date: Dec. 30, 2020

(87) PCT Pub. No.: WO2020/008927
PCT Pub. Date: Jan. 9, 2020

(65) Prior Publication Data
US 2021/0159140 A1 May 27, 2021

(30) Foreign Application Priority Data
Jul. 4, 2018 (JP) .............................. JP2018-127515

(51) Int. Cl.
*H01L 23/367* (2006.01)
*H01L 23/40* (2006.01)
(Continued)

(52) U.S. Cl.
CPC ............ *H01L 23/367* (2013.01); *B61C 17/00* (2013.01); *H01L 23/4006* (2013.01); *H05K 7/20918* (2013.01); *H05K 7/20927* (2013.01)

(58) Field of Classification Search
CPC ............... H05K 7/20927; H05K 7/209; H05K 7/20145; H05K 7/20409–20418;
(Continued)

(56) References Cited

U.S. PATENT DOCUMENTS

| 8,508,030 | B2 * | 8/2013 | Yu ........................ H01L 33/641 257/687 |
| 2008/0305585 | A1 * | 12/2008 | Chainer .................. H01L 23/40 438/122 |

(Continued)

FOREIGN PATENT DOCUMENTS

| JP | 3469475 B2 | 11/2003 |
| JP | 2012138439 | * 7/2012 ............. F28D 15/02 |

(Continued)

OTHER PUBLICATIONS

JP2014121148 English Translation (Year: 2014).*
(Continued)

*Primary Examiner* — Zachary Pape
*Assistant Examiner* — Amir A Jalali
(74) *Attorney, Agent, or Firm* — Buchanan Ingersoll & Rooney PC

(57) ABSTRACT

A vehicle power conversion apparatus according to the present disclosure includes a housing attached to a vehicle, a cooler including a heat receiver that is disposed on the side near the housing and has a heated surface provided with semiconductor elements, and a heat radiator disposed on a surface of the heat receiver opposite to the heated surface, and a position adjusting member to adjust the position of the end of the heat radiator distant from the housing in the direction approaching rigging limit of the vehicle.

16 Claims, 11 Drawing Sheets

(51) Int. Cl.
*H05K 7/20* (2006.01)
*B61C 17/00* (2006.01)

(58) Field of Classification Search
CPC .. H05K 7/20909–20918; H01L 23/367; H01L 23/3672; H01L 23/4006; H01L 23/049; H01L 23/467; B61C 3/00; B61C 17/00; B61D 27/0072
See application file for complete search history.

(56) References Cited

U.S. PATENT DOCUMENTS

| | | | | |
|---|---|---|---|---|
| 2010/0038057 | A1* | 2/2010 | Li | F28D 15/0275 165/80.3 |
| 2011/0149537 | A1* | 6/2011 | Kurosawa | H01L 23/42 361/760 |
| 2016/0225691 | A1* | 8/2016 | Sanda | H01L 23/3672 |
| 2018/0114742 | A1 | 4/2018 | Noshadi et al. | |
| 2019/0206764 | A1* | 7/2019 | Kulkarni | H01L 23/3675 |
| 2021/0195798 | A1* | 6/2021 | Neal | H01L 23/3672 |

FOREIGN PATENT DOCUMENTS

| | | | | |
|---|---|---|---|---|
| JP | 2014121148 | * | 6/2014 | ............ Y02T 10/72 |
| JP | 2015116082 | * | 6/2015 | ............ B60L 15/00 |
| JP | 2016166000 | A | 9/2016 | |

OTHER PUBLICATIONS

JP2014121148 English Translation (Year: 2015).*
JP2012138439 English Translation (Year: 2012).*
International Search Report (PCT/ISA/210) with translation and Written Opinion (PCT/ISA/237) dated Sep. 3, 2019, by the Japan Patent Office as the International Searching Authority for International Application No. PCT/JP2019/024880.
Office Action dated Oct. 6, 2021, in corresponding India Patent Application No. 202027056734, with English translation. (6 pages).

* cited by examiner

VEHICLE POWER CONVERSION DEVICE

TECHNICAL FIELD

The present disclosure relates to a vehicle power conversion apparatus.

BACKGROUND ART

Some existing vehicle power conversion apparatuses have been known, in which heat transferred from a semiconductor element is cooled by introduction of traveling wind generated due to running of a vehicle to a heat radiator, which is disposed on the surface opposite to the surface provided with a heat receiver on which the semiconductor element is mounted (for example, refer to Patent Literature 1).

CITATION LIST

Patent Literature

Patent Literature 1: Japanese Patent No. 3469475

SUMMARY OF INVENTION

Technical Problem

Unfortunately, the existing vehicle power conversion apparatuses cannot achieve introduction of sufficient traveling wind to the heat radiator, leading to impairment in cooling capacity, in the case where the heat radiator is disposed at an inner position relative to a rigging limit.

The present disclosure is made in view of the above-described circumstances, and an objective of the present disclosure is to provide a vehicle power conversion apparatus capable of efficient introduction of traveling wind, leading to improvement in cooling capacity.

Solution to Problem

In order to achieve the aforementioned objective, a vehicle power conversion apparatus according to the present disclosure includes: a housing to be attached to a vehicle; a cooler including a heat receiver that is disposed on the side near the housing and has a heated surface provided with a semiconductor element, and a heat radiator disposed on the surface of the heat receiver opposite to the heated surface; and a position adjusting member to adjust the position of the end of the heat radiator distant from the housing in the direction approaching the rigging limit of the vehicle.

Advantageous Effects of Invention

The vehicle power conversion apparatus according to the present disclosure includes the cooler including the heat receiver that is disposed on the side near the housing to be attached to the vehicle and has the heated surface provided with the semiconductor elements, and the heat radiator disposed on the surface of the heat receiver opposite to the heated surface, and the position adjusting member to adjust the position of the end of the heat radiator distant from the housing in the direction approaching the rigging limit of the vehicle. The vehicle power conversion apparatus can therefore achieve efficient introduction of traveling wind, leading to improvement in cooling capacity.

DESCRIPTION OF EMBODIMENTS

Vehicle power conversion apparatuses according to embodiments of the present disclosure are described with reference to the drawings. Components that are the same are assigned the same reference signs throughout the drawings. The following description of embodiments defines the directions on a first axis (traveling directions) and the directions on a second axis (sleeper directions) orthogonal to each other in the horizontal plane. One of the directions on the first axis is defined as positive direction on the first axis, and the other of the directions on the first axis is defined as negative direction on the first axis. The leftward direction as viewed from the positive side on the first axis is defined as positive direction on the second axis, and the rightward direction as viewed from the positive side on the first axis is defined as negative direction on the second axis. The directions orthogonal to the directions on the first axis and the directions on the second axis are defined as up-down directions. These definitions are provided for illustration purposes only and not intended to limit the present disclosure.

Embodiment 1

Figure 1:
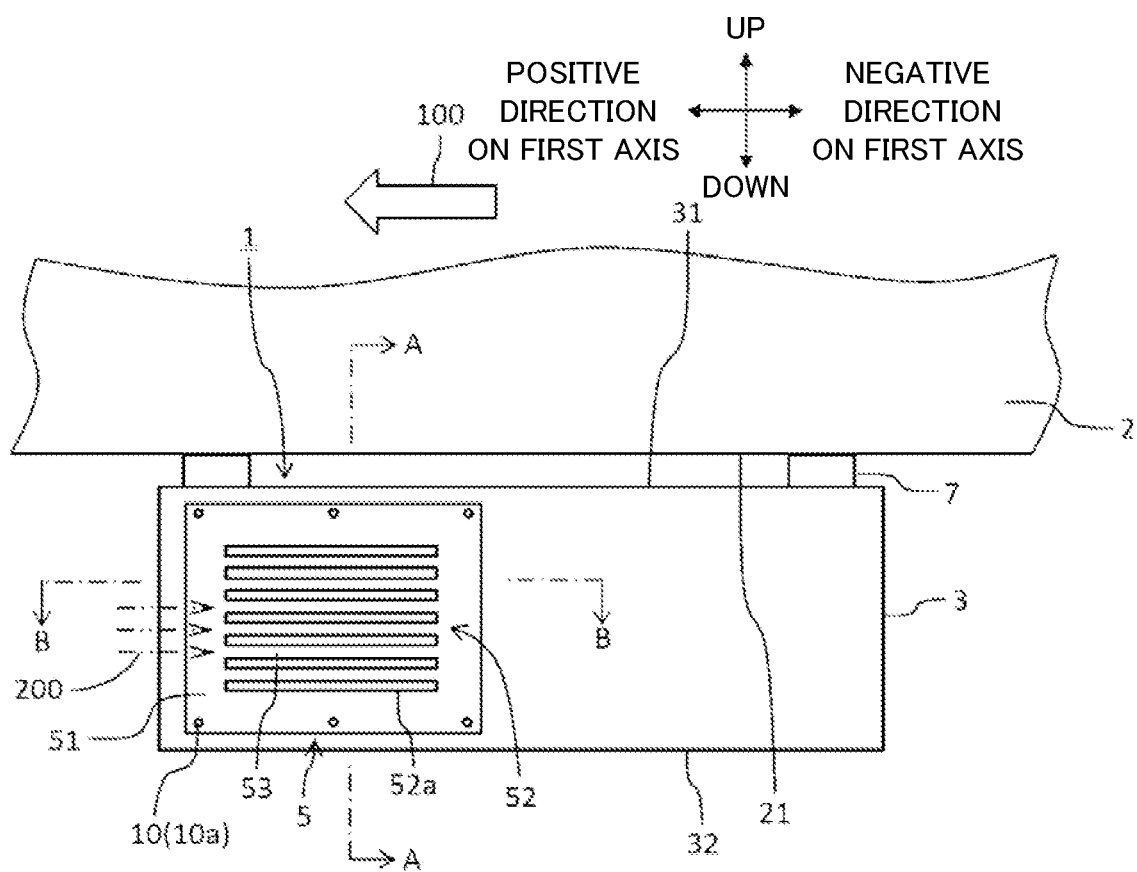
FIG. 1 illustrates an exemplary configuration in which a vehicle power conversion apparatus according to Embodiment 1 of the disclosure is installed under the floor of a vehicle.
Figure 2:
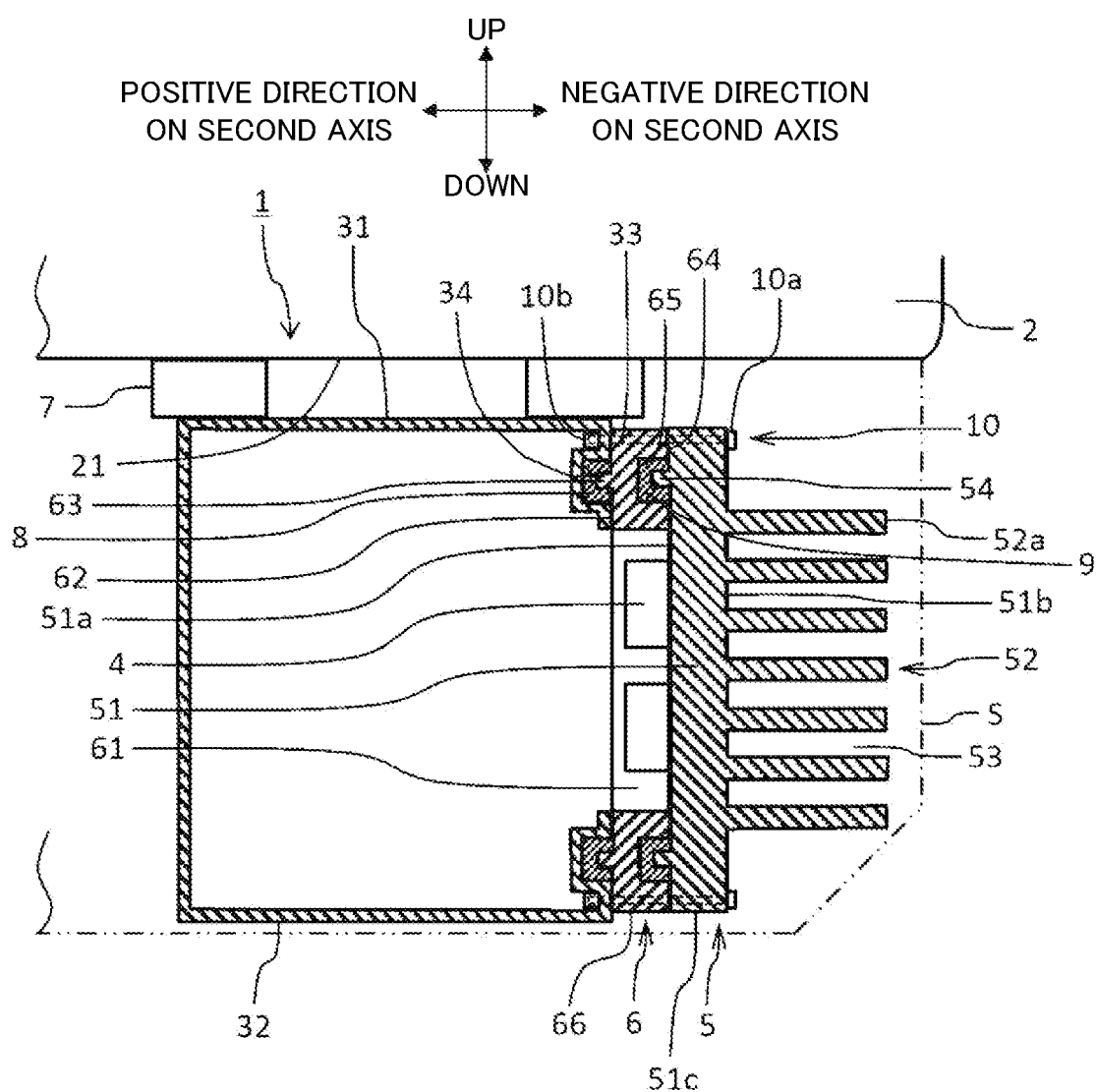
FIG. 2 is a cross-sectional view of the vehicle power conversion apparatus as viewed along the line A-A of FIG. 1.
Figure 3:
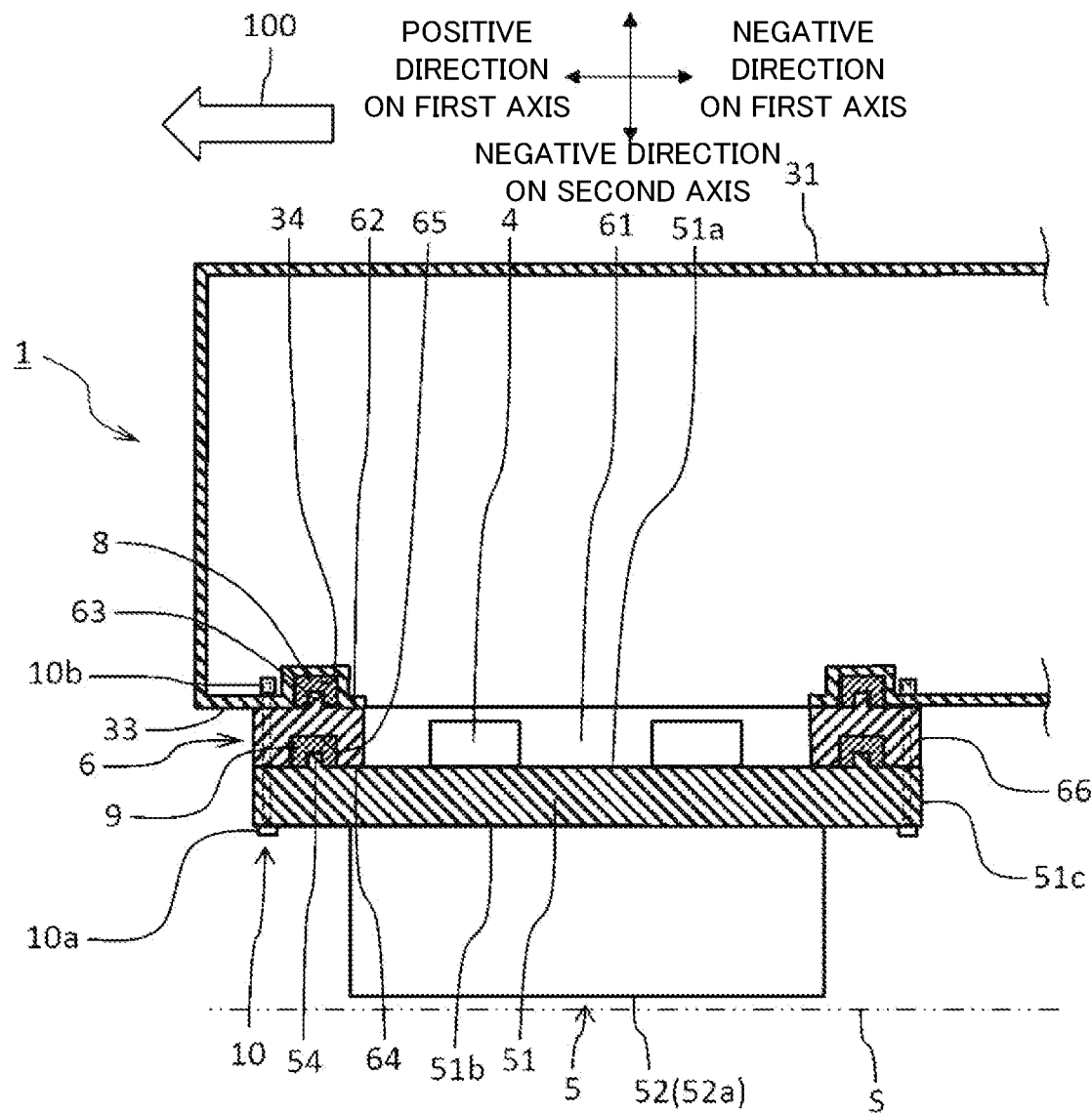
FIG. 3 is a cross-sectional view of the vehicle power conversion apparatus as viewed along the line B-B of FIG. 1.

FIG. 1 illustrates an exemplary configuration in which a vehicle power conversion apparatus according to Embodiment 1 of the present disclosure is installed under the floor of a vehicle. FIG. 2 is a cross-sectional view of the vehicle power conversion apparatus as viewed along the line A-A of FIG. 1. FIG. 3 is a cross-sectional view of the vehicle power conversion apparatus as viewed along the line B-B of FIG. 1. As illustrated in FIGS. 1 to 3, the vehicle power conversion apparatus 1 is installed on a railway vehicle 2 (hereinafter referred to as "vehicle"). The vehicle power conversion apparatus 1 includes a housing 3 fixed under the floor of the vehicle 2, semiconductor elements 4 for power conversion, a cooler 5 for cooling the semiconductor elements 4, and a position adjusting member 6 disposed between the housing 3 and the cooler 5. The vehicle power conversion apparatus 1 causes the semiconductor elements 4 to operate, thereby converting electric power supplied from a non-illustrated overhead wire or the like and outputting the converted electric power to a motor for driving the vehicle. Also, a rigging limit S is defined as a limit of a space under the floor of the vehicle 2, the space under the floor of the vehicle 2 being a space in which vehicle apparatuses such as the vehicle power conversion apparatus 1 can be rigged. The vehicle power conversion apparatus 1 is installed so as to be encompassed in the rigging limit S. That is, the rigging limit S, which is represented by the long dashed double-short dashed line in FIGS. 2 and 3, indicates the boundary of the space for accommodating vehicle apparatuses to be installed under the floor of the vehicle 2. The vehicle power conversion apparatus 1 is required to be installed without protruding from this boundary, so as to avoid physical interference with equipment on the ground, for example.

The housing 3 has a rectangular box shape, for example. As illustrated in FIG. 2, the housing 3 is open on one side of the vehicle 2 (the negative side on the second axis). The housing 3 is provided with hangers 7 on an upper surface 31. The hangers 7 are fixed on a bottom surface 21 of the vehicle 2, thereby installing the housing 3 under the floor of the vehicle 2 such that a bottom surface 32 of the housing 3 is located above the rigging limit S. The housing 3 accommodates, for example, a controller for transmitting switching signals to a power conversion circuit including the semiconductor elements 4, a detector, a power supply and the like, which are not illustrated in detail. The housing 3 is provided with the cooler 5 via the position adjusting member 6, on the open side of the housing 3 (the negative side on the second axis). The position adjusting member 6 has a space 61 for accommodating the semiconductor elements 4 therein.

The semiconductor elements 4 include a switching element, a diode element and the like that operate for converting electric power supplied via a current collector such as a pantograph from the non-illustrated overhead wire, for example. The semiconductor elements 4 generate heat during the operation. The electric power converted by the semiconductor elements 4 is output to the motor for driving the vehicle, for example. The semiconductor elements 4 may convert alternating current (AC) power into direct current (DC) power or convert DC power into AC power. The semiconductor elements 4 made with, for example, a silicon material may be used. Preferably, part or all of the semiconductor elements 4 are made as a wide bandgap semiconductor made with silicon carbide, gallium nitride material, diamond or the like. The semiconductor elements 4 containing the wide bandgap semiconductor have a higher dielectric strength and a higher allowable current density, leading to a reduction in the size of the vehicle power conversion apparatus 1. The semiconductor elements 4 containing the wide bandgap semiconductor also have a higher thermal resistance, leading to a reduction in the size of the cooler 5. Furthermore, these semiconductor elements 4 have lower power loss and are therefore improved in efficiency and can achieve power conversion at higher efficiency.

The cooler 5 is fixed to the open side of the housing 3 (the negative side on the second axis) via the position adjusting member 6. The cooler 5 is a device for cooling the semiconductor elements 4. The cooler 5 includes, for example, a heat receiver 51 and a heat radiator 52, as illustrated in FIGS. 1 to 3.

The heat receiver 51 is, for example, a rectangular plate-shaped cooling block made with a metallic material such as aluminum or copper having a high heat conductivity. The heat receiver 51 has a heated surface 51a located on a side near the housing 3 (the positive side on the second axis). The heated surface 51a is coupled to the semiconductor elements 4 via a heat conductive grease or the like, for example, so that heat from the semiconductor elements 4 are transferred to the heat receiver 51. In the example according to the present embodiment, the heat receiver 51 is disposed such that the heated surface 51a is in parallel to the plane defined by the directions on the first axis and the up-down directions. The heat receiver 51 also has a surface 51b on the side opposite to the heated surface 51a (the negative side on the second axis). The surface 51b is provided with the radiator 52.

The heat radiator 52 has radiating fins 52a, for example, as illustrated in FIGS. 1 and 2. The radiating fins 52a are fins for discharging heat emitted from the semiconductor elements 4. The radiating fins 52a are disposed so as to extend from the heat receiver 51 toward the lateral side of the vehicle 2 (the negative side on the second axis). The heat radiator 52 is disposed such that the ends of the radiating fins 52a on the side distant from the housing 3 (the negative side on the second axis) are encompassed in the rigging limit S. In the example according to the present embodiment, the radiating fins 52a each have a rectangular plate shape and extend in parallel to the plane defined by the directions on the first axis and the directions on the second axis. The radiating fins 52a are arranged in intervals in the up-down directions. The width of the interval between each adjacent two of the radiating fins 52a in the up-down directions is not particularly limited and may be appropriately defined. In the example according to the present embodiment, all the radiating fins 52a are arranged in regular intervals. In such a manner, the radiating fins 52a of the heat radiator 52, which is disposed so as to extend from the heat receiver 51 toward the lateral side of the vehicle 2 (the negative side on the second axis), are arranged in intervals in the up-down directions while being exposed to the outside air. This arrangement forms a flow path 53 extending in the directions on the first axis between each adjacent two of the radiating fins 52a arranged in the up-down directions. Accordingly, for example, when the vehicle 2 runs in a traveling direction 100 indicated by an arrow of FIG. 1, a traveling wind 200 flows through the flow path 53, which is formed between each adjacent two of the radiating fins 52a arranged in the up-down directions, in the direction (negative direction on the first axis) indicated by each arrow of a dashed and double-dotted line. The radiating fins 52a thus discharge heat, which has been transferred from the semiconductor elements 4 via the heat receiver 51, from the surfaces of the radiating fins 52a to the air.

The radiating fins 52a are made with a metallic material such as aluminum or copper having a high heat conductivity, for example and are integrated with the heat receiver 51. The radiating fins 52a are integrated with the surface 51b of the heat receiver 51 on the lateral side of the vehicle 2 (the negative side on the second axis) by brazing or welding, for example. The radiating fins 52a may be provided by being squeezed in grooves provided on the surface 51b of the heat receiver 51, by being formed integrally with the heat receiver 51 using a procedure, such as extrusion molding, or by being fixed on the heat receiver 51 with fasteners, such as bolts. The method of fabricating the radiating fins 52*a* is not particularly limited. The cooler 5 may have a configuration other than the configuration according to the embodiment. For example, the cooler 5 may be replaced with a well-known existing cooler, such as a heat pipe cooler using the phase change of refrigerant, as required.

The position adjusting member 6 has a function as a spacer for adjusting the position of the end of the heat radiator 52 (radiating fins 52*a*) on the side distant from the housing 3 (the negative side on the second axis) in the direction approaching the rigging limit S defined under the vehicle 2 (the negative direction on the second axis, in the present embodiment). The position adjusting member 6 is disposed between the housing 3 and the heat receiver 51.

Figure 4:
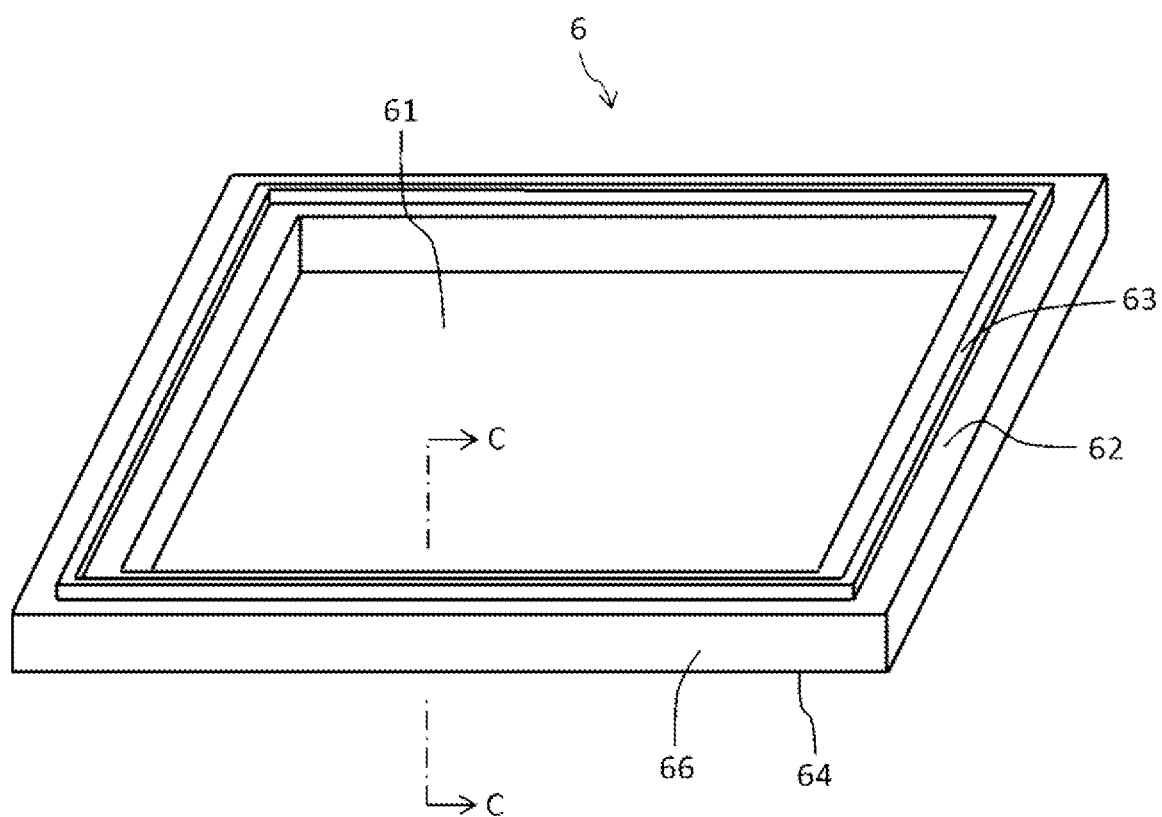
FIG. 4 is a perspective view of an exemplary position adjusting member of the vehicle power conversion apparatus according to Embodiment 1 of the present disclosure.
Figure 5:
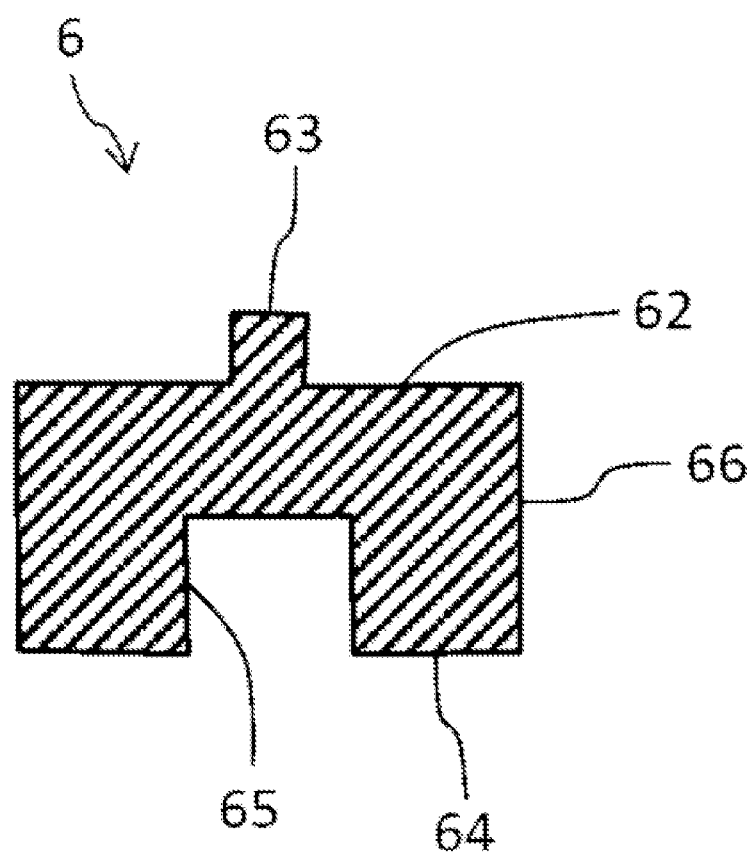
FIG. 5 is a cross-sectional view of the position adjusting member as viewed along the line C-C of FIG. 4.

FIG. 4 is a perspective view of an exemplary position adjusting member of the vehicle power conversion apparatus according to Embodiment 1 of the present disclosure. FIG. 5 is a cross-sectional view of the position adjusting member as viewed along the line C-C of FIG. 4. As illustrated in FIGS. 2 to 4, the position adjusting member 6 has a rectangular frame shape having the same external dimensions as those of the heat receiver 51, for example. The position adjusting member 6 has a space 61 for accommodating the semiconductor elements 4 therein. As illustrated in FIGS. 2 to 5, the position adjusting member 6 has a first water stopper 63 on a surface 62 on the housing 3-side (the positive side on the second axis) and a second water stopper 65 on a surface 64 on the heat receiver 51-side (the negative side on the second axis). The position adjusting member 6 is fabricated by cutting a metallic material such as aluminum into a rectangular frame shape integrally with the first water stopper 63 and the second water stopper 65, for example. The first water stopper 63 and the second water stopper 65 are disposed at the positions opposite to each other on the surface 62 and the surface 64, respectively, as illustrated in FIG. 5.

The first water stopper 63 serves to prevent fluid, such as rainwater, from entering inside through the gap between the position adjusting member 6 and the housing 3. The first water stopper 63 has a protrusion protruding toward the housing 3. The first water stopper 63 has a rectangular frame shape along the entire surface 62 of the position adjusting member 6. As illustrated in FIGS. 2 and 3, the first water stopper 63 is configured to press a gasket 8 that is held with the gasket 8 being fitted in a recess (gasket retainer) 34 when the position adjusting member 6 is attached to the housing 3, for example. The recess 34 has a rectangular frame shape and is formed on a surface 33 along the peripheral edge of the open side of the housing 3 (the negative side on the second axis).

The second water stopper 65 serves to prevent fluid, such as rainwater, from entering inside through the gap between the position adjusting member 6 and the heat receiver 51. The second water stopper 65 has a recess for retaining a gasket 9 held therein. The second water stopper 65 has a rectangular frame shape along the entire surface 64 of the position adjusting member 6. As illustrated in FIGS. 2 and 3, the second water stopper 65 is configured such that the gasket 9 is pressed by a protrusion (gasket presser) 54 when the position adjusting member 6 is attached to the heat receiver 51, for example. The protrusion 54 has a rectangular frame shape and is formed on the peripheral edge of the heated surface 51*a* of the heat receiver 51.

The position adjusting member 6 may have a structure other than the structure according to the present embodiment. The first water stopper 63 may also be a recess for retaining the gasket 8 held therein. In this case, the surface 33 along the peripheral edge on the open side of the housing 3 (the negative side on the second axis) has only to have a protrusion (gasket presser) having a rectangular frame shape for urging the gasket 8. In addition, the second water stopper 65 may also be a protrusion for urging the gasket 9. In this case, the peripheral edge of the heated surface 51*a* of the heat receiver 51 has only to have a recess for retaining the gasket 9 held therein. Alternatively, the first water stopper 63 may be replaced with a sealing member (not shown) for stopping water provided in a boundary region between the position adjusting member 6 and the housing 3, for example. Also, the second water stopper 65 may be replaced with a sealing member (not shown) for stopping water provided in a boundary region between the position adjusting member 6 and the heat receiver 51, for example.

The position adjusting member 6 is fixed to the housing 3 with fasteners 10, together with the heat receiver 51, for example, as illustrated in FIGS. 2 and 3. The fasteners 10 include bolts 10*a* and nuts 10*b*, for example. The heat receiver 51 and the position adjusting member 6 are each provided with non-illustrated through holes extending in the directions on the second axis and capable of receiving the bolts 10*a*. These through holes are disposed at the respective positions corresponding to each other on the heat receiver 51 and the position adjusting member 6. The positions of the through holes are aligned such that the through holes are in communication with non-illustrated individual holes that extend through the surface 33 of the housing 3 in the directions on the second axis. The nuts 10*b* to be screwed with the bolts 10*a* are fixed to an inside portion of the surface 33 of the housing 3 by a procedure such as welding. The bolts 10*a* are inserted through the through holes in the heat receiver 51 and the position adjusting member 6 and the holes on the surface 33 of the housing 3 and then screwed to the nuts 10*b*, so that the position adjusting member 6 is fixed to the housing 3 together with the heat receiver 51.

Since the position adjusting member 6 has the same external dimensions as those of the heat receiver 51, an outer peripheral surface 66 of the position adjusting member 6 is flush with an outer peripheral surface 51*c* of the heat receiver 51. Since the position adjusting member 6 is fixed to the housing 3 together with the heat receiver 51, the gasket 8 held in the recess 34 on the surface 33 of the housing 3 is pressed by the first water stopper 63 while the gasket 9 held in the second water stopper 65 is pressed by the protrusion 54 formed on the heated surface 51*a* of the heat receiver 51. The heat receiver 51 thus closes the opening of the position adjusting member 6 on the lateral side of the vehicle 2 (the negative side on the second axis), such that the space 61 inside the position adjusting member 6 and the space inside the housing 3 are sealed while adjoining each other, as illustrated in FIGS. 2 and 3. The semiconductor elements 4 coupled to the heated surface 51*a* of the heat receiver 51 are disposed in the sealed space 61 inside the position adjusting member 6. Although the entire semiconductor elements 4 are accommodated in the space 61 inside the position adjusting member 6 in the example according to the present embodiment, the semiconductor elements 4 may also be disposed across the space 61 inside the position adjusting member 64 and the space inside the housing 3, depending on the thickness of the position adjusting member 6, for example. Although the position adjusting member 6 is disposed between the housing 3 and the heat receiver 51 in the example according to the embodiment, the position adjusting member 6 may also be disposed between the bottom surface 21 of the vehicle 2 and the hangers 7 or between the hangers 7 and the housing 3, so as to adjust the position of the end of the heat radiator 52 in the direction approaching the rigging limit S defined under the vehicle 2.

The vehicle power conversion apparatus 1 according to Embodiment 1 of the present disclosure includes: the housing 3 attached to the vehicle 2; the cooler 5 including the heat receiver 51 that is disposed on the side near the housing 3 and has the heated surface 51a provided with the semiconductor elements 4, and the heat radiator 52 disposed on the surface 51b of the heat receiver 51 opposite to the heated surface 51a; and the position adjusting member 6 to adjust the position of the end of the heat radiator 52 distant from the housing 3 in the direction approaching the rigging limit S defined under the vehicle 2. The vehicle power conversion apparatus 1 can therefore achieve efficient introduction of the traveling wind 200, leading to improvement in cooling capacity.

Figure 6:
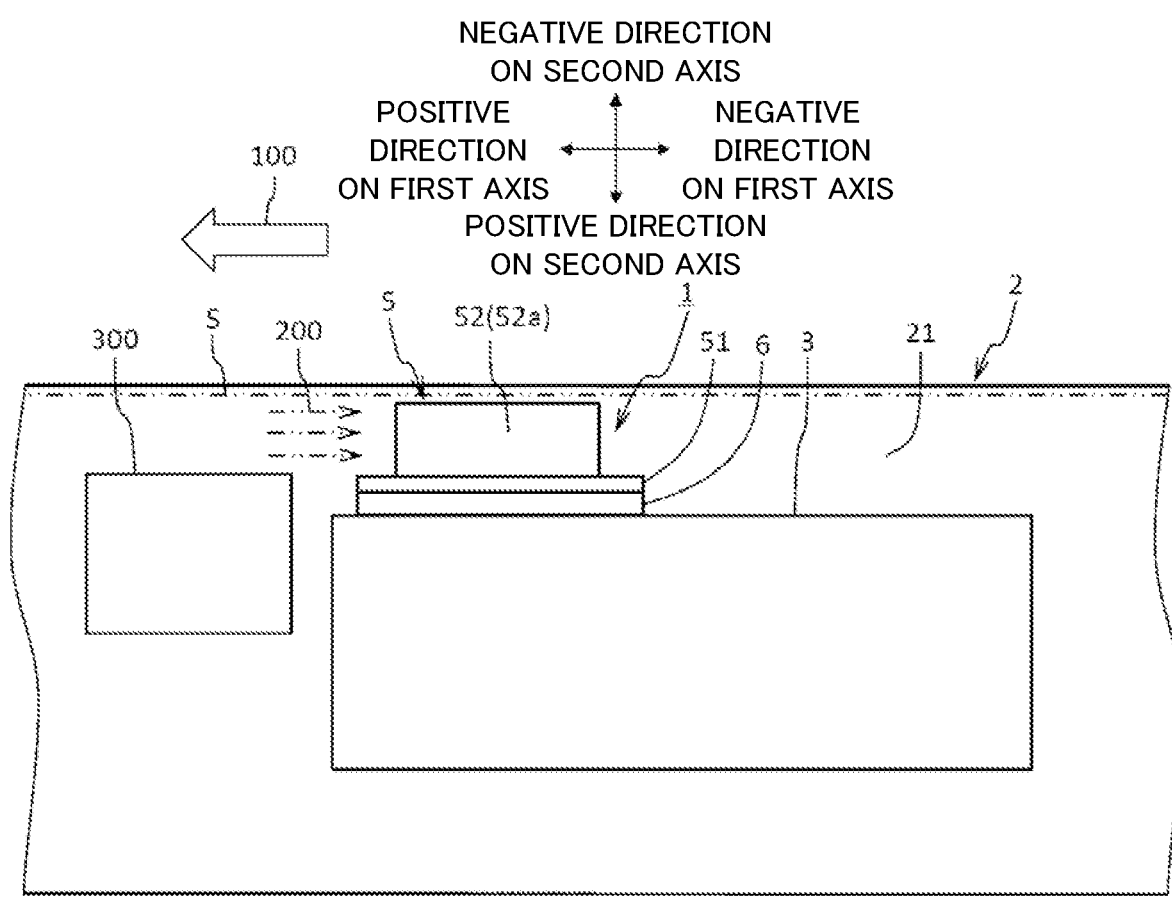
FIG. 6 is an exemplary view of the vehicle power conversion apparatus according to Embodiment 1 of the disclosure as viewed from the bottom surface of the vehicle.

FIG. 6 is an exemplary view of the vehicle power conversion apparatus according to Embodiment 1 of the present disclosure as viewed from the bottom surface side of the vehicle. The vehicle 2 may include another device 300 ahead of the vehicle power conversion apparatus 1 in the frontward traveling direction 100 of the vehicle 2 (the positive direction on the first axis), for example, as illustrated in FIG. 6. The device 300 not equipped with the position adjusting member 6 at such a position may block the traveling wind 200, leading to failure in introduction of sufficient traveling wind 200 to the heat radiator 52. In contrast, in the vehicle power conversion apparatus 1 according to Embodiment 1 of the disclosure, the position adjusting member 6 is able to shift the heat radiator 52 in the direction approaching the rigging limit S (the negative direction on the second axis) to the position at which the traveling wind 200 to the heat radiator 52 is not blocked by the device 300, as illustrated in FIG. 6. The vehicle power conversion apparatus 1 can therefore achieve efficient introduction of sufficient traveling wind 200 to the heat radiator 52, leading to improvement in cooling capacity.

In the vehicle power conversion apparatus 1 according to Embodiment 1 of the present disclosure, the position adjusting member 6 is disposed between the housing 3 and the heat receiver 51. The position adjusting member 6 can thus adjust the position of the end of the heat radiator 52 in the direction approaching the rigging limit S defined under the vehicle 2 without detachment of the housing 3 from the vehicle 2. The housing 3 is therefore not required to be displaced.

In the vehicle power conversion apparatus 1 according to Embodiment 1 of the disclosure, the position adjusting member 6 has the space 61 for accommodating the semiconductor elements 4 therein. The position adjusting member 6 can thus be disposed between the housing 3 and the heat receiver 51 without displacement of the semiconductor elements 4 coupled to the heated surface 51a of the heat receiver 51, for example.

In the vehicle power conversion apparatus 1 according to Embodiment 1 of the present disclosure, the position adjusting member 6 is integrally formed into a rectangular frame shape. The position adjusting member 6 can thus adjust the position of the end of the heat radiator 52 in the direction approaching the rigging limit S defined under the vehicle 2, while maintaining the semiconductor elements 4 in the space 61 defined within the rectangular frame. The position adjusting member 6 is integrally formed and can therefore prevent fluid, such as rainwater, from entering inside without using sealing member or the like for connection portions, unlike a case in which a device is assembled by connecting multiple members to one another.

In the vehicle power conversion apparatus 1 according to Embodiment 1 of the present disclosure, the position adjusting member 6 is disposed such that the outer peripheral surface 66 is flush with the outer peripheral surface 51c of the heat receiver 51. This configuration provides no step or the like at the boundary between the position adjusting member 6 and the heat receiver 51, and can readily achieve position alignment.

In the vehicle power conversion apparatus 1 according to Embodiment 1 of the present disclosure, the surface 62 of the position adjusting member 6 on the housing 3-side is provided with the first water stopper 63 for preventing fluid from entering inside through the gap between the position adjusting member 6 and the housing 3. This configuration can prevent fluid from entering inside without an additional member, such as sealing member, in the boundary region between the position adjusting member 6 and the housing 3.

In the vehicle power conversion apparatus 1 according to Embodiment 1 of the present disclosure, the surface 64 of the position adjusting member 6 on the heat receiver 51-side is provided with the second water stopper 65 for preventing fluid from entering inside through the gap between the position adjusting member 6 and the heat receiver 51. This configuration can prevent fluid from entering inside without an additional member, such as sealing member, in the boundary region between the position adjusting member 6 and the heat receiver 51.

In the vehicle power conversion apparatus 1 according to Embodiment 1 of the present disclosure, the first water stopper 63 and the second water stopper 65 are disposed at the positions opposite to each other on the surface 62 of the position adjusting member 6 on the housing 3-side and the surface 64 of the position adjusting member 6 that is on the heat receiver 51-side, respectively. The first water stopper 63 and the second water stopper 65 can thus be preliminarily formed into the structures corresponding to the housing 3 and the heat receiver 51, respectively. The position adjusting member 6 can therefore be installed without any modification of the structure of the housing 3 or the heat receiver 51.

The vehicle power conversion apparatus 1 according to Embodiment 1 of the present disclosure includes the fasteners 10 for fixing the position adjusting member 6 to the housing 3 together with the heat receiver 51. The position adjusting member 6 can thus be readily detached and replaced by loosening the fasteners 10. That is, the position adjusting member 6 can readily be detached and replaced, for example, depending on the position of another device as an obstacle and the size of the cooler 5, without a large-scale manipulation, such as detachment of the entire vehicle power conversion apparatus 1 from the vehicle 2.

In the vehicle power conversion apparatus 1 according to Embodiment 1 of the present disclosure, the semiconductor elements 4 is made as the wide bandgap semiconductor and therefore have a higher dielectric strength and a higher allowable current density, leading to a reduction in the size of the vehicle power conversion apparatus 1. The semiconductor elements 4 containing the wide bandgap semiconductor also have a higher thermal resistance, leading to a reduction in the size of the cooler 5. Furthermore, these semiconductor elements 4 have lower power loss and are therefore improved in efficiency and can achieve power conversion at higher efficiency.

Embodiment 2

A vehicle power conversion apparatus 1a according to Embodiment 2 of the present disclosure is described with reference to FIGS. 7 to 10. The components and the like identical to those in the vehicle power conversion apparatus 1 according to Embodiment 1 of the disclosure are provided with the same reference symbol without redundant description.

Figure 7:
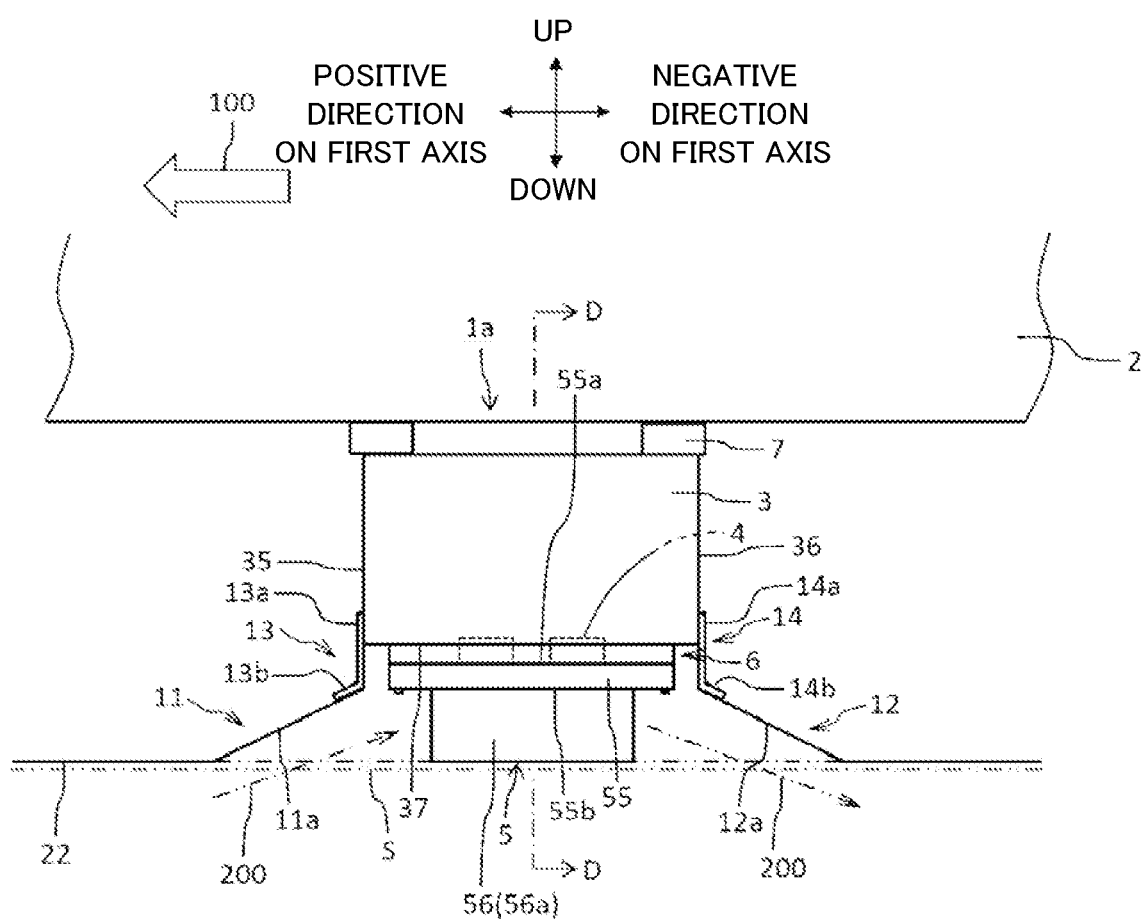
FIG. 7 is a side view of a vehicle power conversion apparatus according to Embodiment 2 of the present disclosure.
Figure 8:
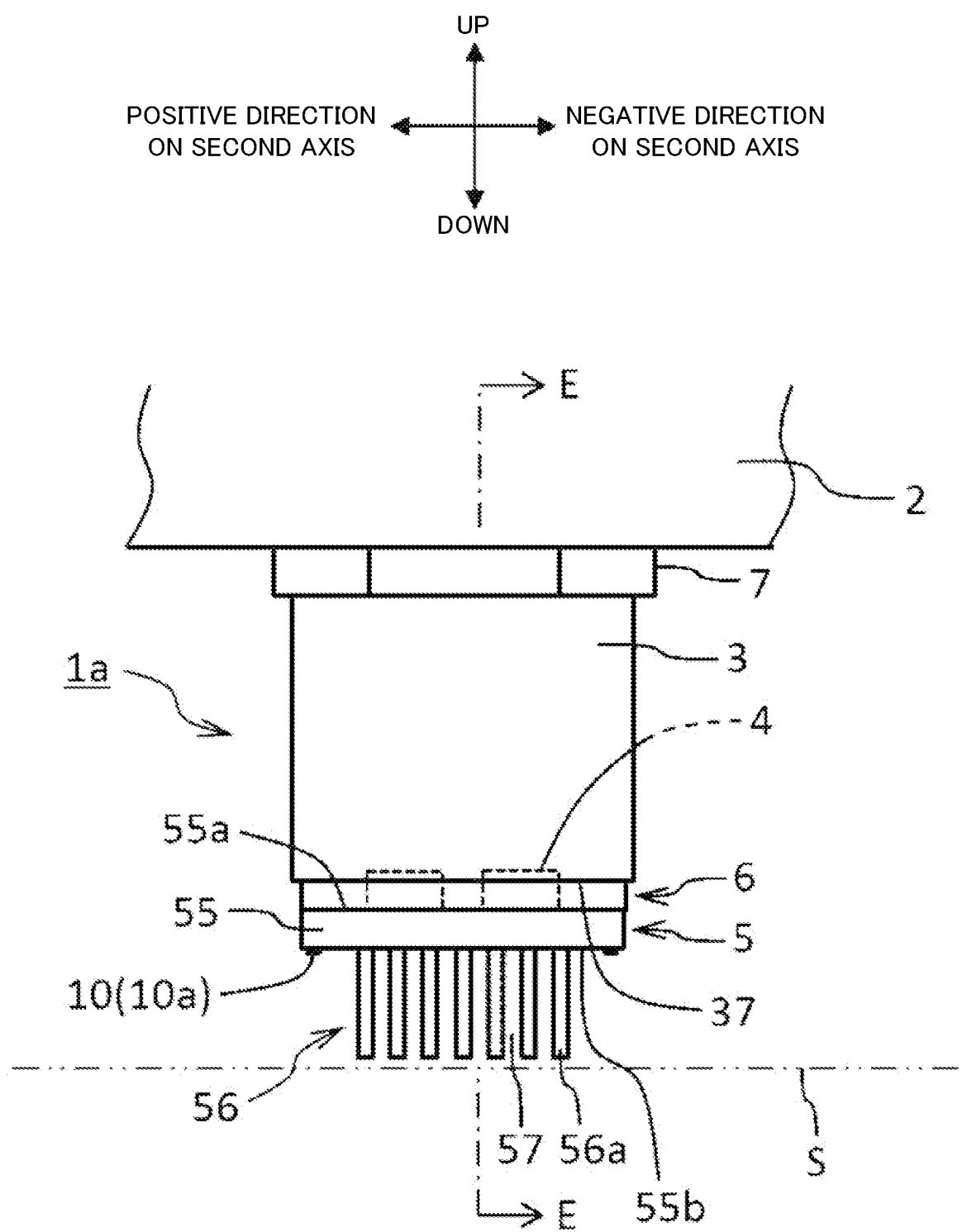
FIG. 8 is a front view of the vehicle power conversion apparatus according to Embodiment 2 of the present disclosure.
Figure 9:
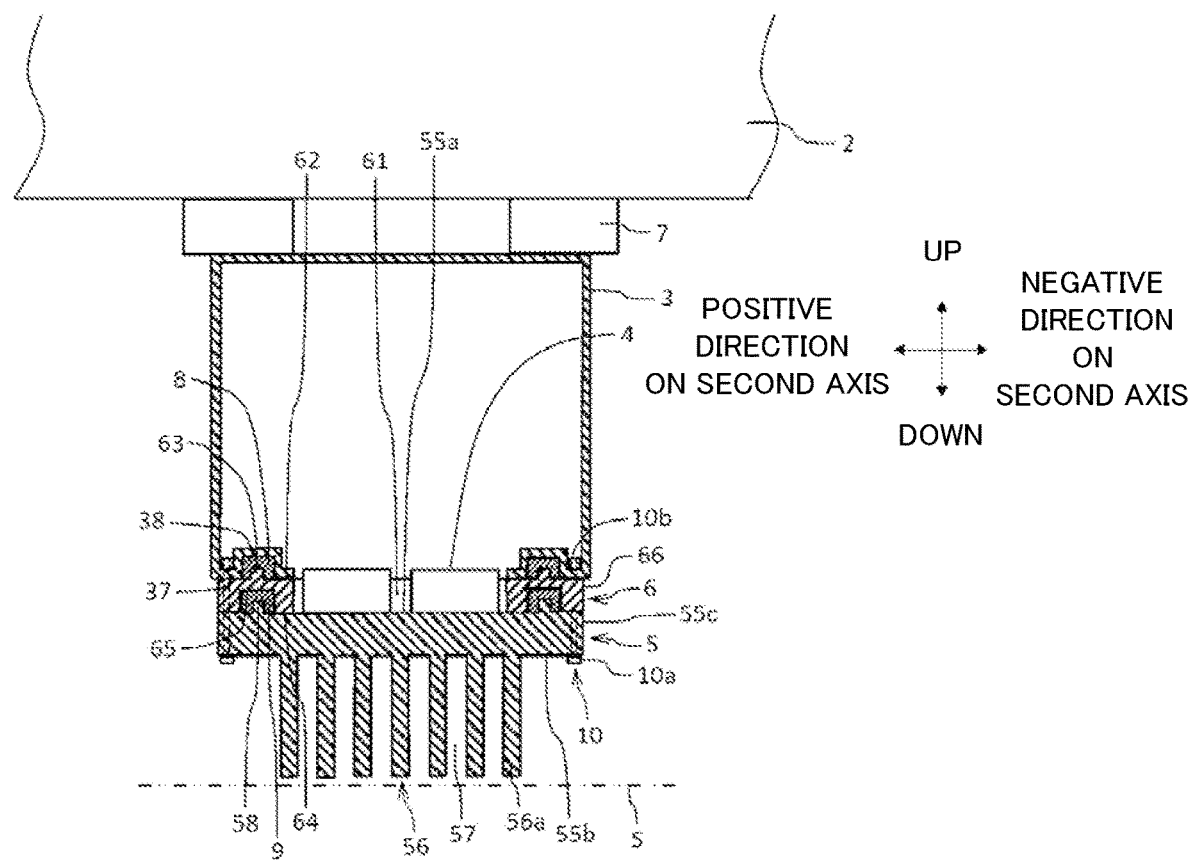
FIG. 9 is a cross-sectional view of the vehicle power conversion apparatus as viewed along the line D-D of FIG. 7.
Figure 10:
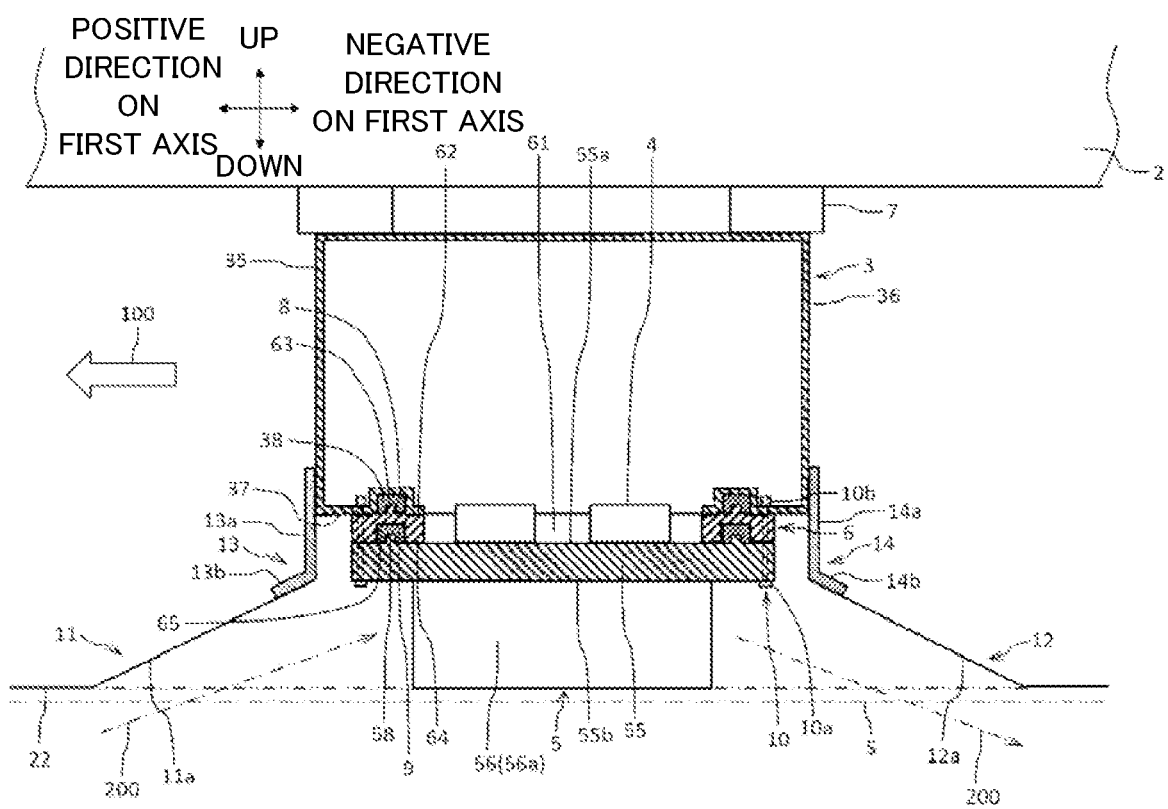
FIG. 10 is a cross-sectional view of the vehicle power conversion apparatus as viewed along the line E-E of FIG. 8.

FIG. 7 is a side view of the vehicle power conversion apparatus 1a according to Embodiment 2 of the present disclosure. FIG. 8 is a front view of the vehicle power conversion apparatus 1a according to Embodiment 2 of the present disclosure. FIG. 9 is a cross-sectional view of the vehicle power conversion apparatus 1a as viewed along the line D-D of FIG. 7. FIG. 10 is a cross-sectional view of the vehicle power conversion apparatus 1a as viewed along the line E-E of FIG. 8.

As illustrated in FIGS. 7 to 10, the vehicle power conversion apparatus 1a includes the housing 3 fixed under the floor of the vehicle 2, the semiconductor elements 4 for power conversion, the cooler 5 for cooling the semiconductor elements 4, and the position adjusting member 6 disposed between the housing 3 and the cooler 5. The housing 3 of the vehicle power conversion apparatus 1a has a rectangular box shape and is open on the lower side, as illustrated in FIGS. 9 and 10. The hangers 7 are fixed to the vehicle 2, thereby installing the housing 3 under the floor of the vehicle 2 such that the lower ends of the radiating fins 52a are located above the rigging limit S defined under the vehicle 2.

The cooler 5 according to the present embodiment is fixed to the lower side of the housing 3 via the position adjusting member 6. The cooler 5 is a device for cooling the semiconductor elements 4. The cooler 5 includes a heat receiver 55 and a heat radiator 56. The heat receiver 55 has a heated surface 55a, which corresponds to the upper surface near the housing 3 and is coupled to the semiconductor elements 4. According to the present embodiment, the heat receiver 55 is disposed such that the heated surface 55a is in parallel to the plane (horizontal plane) defined by the directions on the first axis and the directions on the second axis. The heat receiver 55 also has a lower surface 55b, which is opposite to (below) the heated surface 55a and is provided with the heat radiator 56.

The heat radiator 56 has radiating fins 56a, as illustrated in FIGS. 8 and 9. The radiating fins 56a are disposed so as to extend downward from the lower surface 55b of the heat receiver 55. The heat radiator 56 is disposed such that the ends (lower ends) of the radiating fins 56a on the side distant from the housing 3 (the lower side) are located above the rigging limit S. In the example according to the present embodiment, the radiating fins 56a are formed to each have a rectangular plate shape and are arranged to be parallel to the plane defined by the directions on the first axis and the up-down directions. The radiating fins 56a are arranged in intervals in the directions on the second axis. The width of the interval between each adjacent two of the radiating fins 56a in the directions on the second axis is not particularly limited and may be appropriately defined. In the example according to the present embodiment, all the radiating fins 56a are arranged in regular intervals. That is, the radiating fins 56a of the heat radiator 56, which are disposed to extend downward from the heat receiver 55, are arranged in intervals in the directions on the second axis while being exposed to the outside air. This arrangement forms a flow path 57 extending in the directions on the first axis between each adjacent two of the radiating fins 56a arranged in the directions on the second axis.

According to the present embodiment, the vehicle 2 further includes a first slope 11 and a second slope 12 that are respectively disposed on a bottom surface 22, on the side of introduction of the traveling wind 200 (the positive side on the first axis) of the vehicle power conversion apparatus 1a and the side of discharge of the traveling wind 200 (the negative side on the second axis) of the vehicle power conversion apparatus 1a, as illustrated in FIGS. 7 and 10. The first slope 11 has a slant surface 11a inclined downward in the direction away from the heat radiator 56 to the front side of the traveling direction of the vehicle 2 (the positive side on the first axis), so as to efficiently introduce the traveling wind 200 to the heat radiator 56. The second slope 12 has a slant surface 12a inclined downward in the direction away from the heat radiator 56 to the rear side of the traveling direction of the vehicle 2 (the negative side on the first axis), so as to guide the traveling wind 200 that has passed through the heat radiator 56 to the rear side of the traveling direction of the vehicle 2 (the negative side on the first axis).

The vehicle power conversion apparatus 1a according to the present embodiment includes an L-shaped first joint member 13 fabricated by bending in accordance with the inclination angle of the slant surface 11a and an L-shaped second joint member 14 fabricated by bending in accordance with the inclination angle of the slant surface 12a. The first joint member 13 has a fixed segment 13a to be fixed to a side surface 35 of the housing 3 on the positive side on the first axis with non-illustrated fasteners or the like (not shown), and a joint segment 13b bent from the lower end of the fixed segment 13a in accordance with the inclination angle of the slant surface 11a to be coupled to the upper portion of the slant surface 11a with non-illustrated fasteners or the like. The first slope 11 is thus fixed by being coupled to the side surface 35 of the housing 3 via the first joint member 13, for example. The second joint member 14 has a fixed segment 14a to be fixed to a side surface 36 of the housing 3 on the negative side on the first axis with non-illustrated fasteners or the like, and a joint segment 14b bent from the lower end of the fixed segment 14a in accordance with the inclination angle of the slant surface 12a to be coupled to the upper portion of the slant surface 12a with non-illustrated fasteners or the like. The second slope 12 is thus fixed by being coupled to the side surface 36 of the housing 3 via the second joint member 14, for example. FIG. 8 does not illustrate the first slope 11 or the first joint member 13. The first joint member 13 and the second joint member 14 may have a structure other than the structure according to the embodiment and are only required to fix the first slope 11 and the second slope 12, respectively, to the housing 3.

The position adjusting member 6 has a function as a spacer for adjusting the position of the end of the heat radiator 56 (radiating fins 56a) on the side distant from the housing 3 (the lower side) in the direction approaching the rigging limit S (the downward direction, in the present embodiment) defined under the vehicle 2. The position adjusting member 6 is disposed between the housing 3 and the heat receiver 55. The position adjusting member 6 has a structure basically the same as that illustrated in FIG. 4 and is not redundantly described in detail. According to the present embodiment, the first water stopper 63 is configured to press the gasket 8 that is held with the gasket 8 being fitted in a recess (gasket retainer) 38 when the position adjusting member 6 is attached to the housing 3, for example, as illustrated in FIGS. 9 and 10. The recess 38 has a rectangular frame shape and is formed on a bottom surface 37 along the peripheral edge of the open side of the housing 3 (the lower side). The second water stopper 65 retains the gasket 9 held therein. The second water stopper 65 is configured such that the gasket 9 is pressed by a protrusion (gasket presser) 58 when the position adjusting member 6 is attached to the heat receiver 55, for example. The protrusion 58 has a rectangular frame shape and is formed on the peripheral edge of the heated surface 55a of the heat receiver 55.

As in Embodiment 1, the position adjusting member 6 may have a structure other than the structure according to the present embodiment. The first water stopper 63 may also be a recess for retaining the gasket 8 held therein. In this case, the bottom surface 37 along the peripheral edge on the lower side of the housing 3 has only to have a protrusion (gasket presser) having a rectangular frame shape for urging the gasket 8. In addition, the second water stopper 65 may also be a protrusion for urging the gasket 9. In this case, the peripheral edge of the heated surface 55a of the heat receiver 55 has only to do have a recess for retaining the gasket 9 held therein. Alternatively, the first water stopper 63 may be replaced with a sealing member (not shown) for stopping water provided in a boundary region between the position adjusting member 6 and the housing 3, for example. Also, the second water stopper 65 may be replaced with a sealing member (not shown) for stopping water provided in a boundary region between the position adjusting member 6 and the heat receiver 55, for example.

As in Embodiment 1, the position adjusting member 6 is fixed to the housing 3 with the fasteners 10 including the bolts 10a and the nuts 10b, together with the heat receiver 55, for example, as illustrated in FIGS. 9 and 10. Since the position adjusting member 6 has the same external dimensions as those of the heat receiver 55, the outer peripheral surface 66 of the position adjusting member 6 is flush with an outer peripheral surface 55c of the heat receiver 55. Since the position adjusting member 6 is fixed to the housing 3 together with the heat receiver 55, the gasket 8 held in the recess 38 on the bottom surface 37 of the housing 3 is pressed by the first water stopper 63 while the gasket 9 held in the second water stopper 65 is pressed by the protrusion 58 formed on the heated surface 55a of the heat receiver 55. The heat receiver 55 thus closes the opening of the position adjusting member 6 on the lower side, such that the space 61 inside the position adjusting member 6 and the space inside the housing 3 are sealed while adjoining each other, as illustrated in FIGS. 9 and 10. The semiconductor elements 4 coupled to the heated surface 55a of the heat receiver 55 are then disposed across the space 61 inside the position adjusting member 6 and the space inside the housing 3 in the sealed state. Although the entire semiconductor elements 4 are accommodated across the space 61 inside the position adjusting member 6 and the space inside the housing 3 in the example according to the present embodiment, the entire semiconductor elements 4 may also be accommodated in the space 61 inside the position adjusting member 6, depending on the thickness of the position adjusting member 6, for example.

The position adjusting member 6 is disposed such that the end of the heat radiator 56 on the lower side is located above the rigging limit S defined under the vehicle 2. In the example according to the present embodiment, the position adjusting member 6 is disposed such that the end of the heat radiator 56 is located at the same height as the lower ends of the slant surfaces 11a and 12a of the first slope 11 and the second slope 12, as illustrated in FIGS. 7 and 10. This height is higher than the rigging limit S by a certain distance.

The bottom surface 37 of the housing 3 is located higher than the upper ends of the slant surfaces 11a and 12a, and the lower surface 55b of the heat receiver 55 opposite to the heated surface 55a is located at the same height or lower than the upper ends of the slant surfaces 11a and 12a. In the example according to the present embodiment, the position adjusting member 6 is disposed such that the upper ends of the slant surfaces 11a and 12a are located at the same height as the lower surface 55b of the heat receiver 55, as illustrated in FIGS. 7 and 10. The positions of the upper ends of the slant surfaces 11a and 12a can be varied by, for example, adjusting the lower-side dimensions of the fixed segment 13a of the first joint member 13 and the fixed segment 14a of the second joint member 14, respectively. For example, in order to descend the positions of the upper ends of the slant surfaces 11a and 12a, the fixed segment 13a of the first joint member 13 and the fixed segment 14a of the second joint member 14 has only to have lower-side dimensions extended depending on the distance of descending the positions of the upper ends of the slant surfaces 11a and 12a. The position adjusting member 6 is disposed between the housing 3 and the heat receiver 55 in the example according to the present embodiment, but may be disposed between the vehicle 2 and the hangers 7 or between the hangers 7 and the housing 3 for adjusting the position of the end of the heat radiator 56 in the direction approaching the rigging limit S defined under the vehicle 2.

In the vehicle power conversion apparatus 1a according to Embodiment 2 of the present disclosure, the heat radiator 56 is disposed below the housing 3, and the position adjusting member 6 is disposed such that the end of the heat radiator 56 is located above the rigging limit S defined under the vehicle 2. This configuration can achieve efficient introduction of the traveling wind 200, leading to improvement in cooling capacity, without causing the heat radiator 56 to protrude from the rigging limit S.

In the vehicle power conversion apparatus 1a according to Embodiment 2 of the present disclosure, the bottom surface 37 of the housing 3 is located higher than the upper end of the slant surface 11a of the vehicle 2, which is inclined downward in a direction away from the heat radiator 56 with respect to the traveling direction of the vehicle 2 so as to introduce the traveling wind 200 to the heat radiator 56. In addition, the lower surface 55b of the heat receiver 55 opposite to the heated surface 55a is located at the same height or lower than the upper end of the slant surface 11a. This configuration can achieve a shorter length of the slant surface 11a in the traveling direction (the positive direction on the first axis) and a smaller height of the slant surface 11a in the up-down directions without displacement of the housing 3, in comparison to the configuration in which the upper end of the slant surface 11a is located at the same height or higher than the bottom surface 37 of the housing 3.

Figure 11:
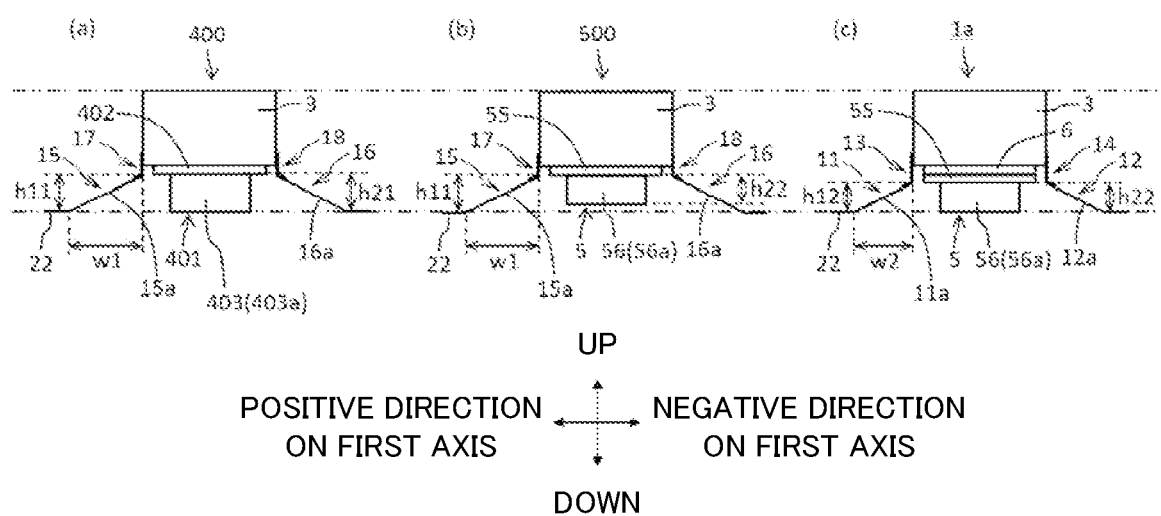
FIG. 11 illustrates exemplary installation manners of the vehicle power conversion apparatuses.

FIG. 11 illustrates exemplary installation manners of vehicle power conversion apparatuses. The section (a) of FIG. 11 illustrates an exemplary installation manner of a vehicle power conversion apparatus 400 not equipped with the position adjusting member 6. The vehicle power conversion apparatus 400 includes a first slope 15 having a slant surface 15a on the positive side on the first axis and a second slope 16 having a slant surface 16a on the negative side on the first axis. The first slope 15 and the second slope 16 are fixed to the housing 3 via a first joint member 17 and a second joint member 18, respectively. The upper ends of the slant surfaces 15a and 16a are located at the same height as the lower surface of a heat receiver 402 of a cooler 401 of the vehicle power conversion apparatus 400. The lower ends of the slant surfaces 15a and 16a are located at the same height as the lower end of a heat radiator 403 (radiating fins 403a) of the cooler 401. The slant surfaces 15a and 16a have a height h11 in the up-down directions and a width w1 in the directions on the first axis. The radiating fins 403a have a height (dimension in the up-down directions) h21, which is approximately the same as the height h11 of the slant surface 16a in the up-down directions (h21≈h11).

The section (b) of FIG. 11 illustrates an exemplary installation manner of a vehicle power conversion apparatus 500, in which non-illustrated semiconductor elements are made, for example, as a wide bandgap semiconductor and thus have a higher thermal resistance, leading to a reduction in height of the heat radiator 56 (radiating fins 56a) of the cooler 5. The vehicle power conversion apparatus 500 includes the first slope 15 on the positive side on the first axis and the second slope 16 on the negative side on the first axis, like the vehicle power conversion apparatus 400 illustrated in the section (a) of FIG. 11. In contrast, the radiating fins 56a in the vehicle power conversion apparatus 500 have a height (length in the up-down directions) h22, which is smaller than the height h21 of the radiating fins 403a illustrated in the section (a) of FIG. 11 (h21>h22). The upper ends of the radiating fins 56a are, however, located at the same height as the upper ends of the radiating fins 403a. The lower ends of the radiating fins 56a are thus located higher than the lower ends of the slant surfaces 15a and 16a in the vehicle power conversion apparatus 500. That is, the heat radiator 56 is located at an inner position higher than the lower ends of the slant surfaces 15a and 16a in the vehicle power conversion apparatus 500. The slant surfaces 15a and 16a in the vehicle power conversion apparatus 500 have the same height h11 in the up-down directions and the same width w1 in the directions on the first axis, as those of the vehicle power conversion apparatus 400 illustrated in the section (a) of FIG. 11.

In contrast, in the vehicle power conversion apparatus 1a according to Embodiment 2 of the present disclosure illustrated in the section (c) of FIG. 11, the position adjusting member 6 is able to adjust the position of the heat radiator 56. In the vehicle power conversion apparatus 1a illustrated in FIG. 11, the lower ends of the radiating fins 56a are shifted to the same height as the lower ends of the slant surfaces 11a and 12a by means of the position adjusting member 6. The upper ends of the slant surfaces 11a and 12a are only required to be located such that traveling winds can be introduced to the upper ends of the radiating fins 56a. Accordingly, the upper ends of the slant surfaces 11a and 12a can be descended to the same height as the lower surface of the heat receiver 55 provided with the upper ends of the radiating fins 56a, depending on the position of the heat radiator 56 adjusted by the position adjusting member 6, as illustrated in the section (c) of FIG. 11. In the case where the slant surfaces 11a and 12a are provided at the same inclination angles as those of the respective slant surfaces 15a and 16a illustrated in the section (a) or (b) of FIG. 11, the height h12 of the slant surfaces 11a and 12a in the up-down directions can be designed to be smaller than the height h11 of the slant surfaces 15a and 16a in the up-down directions (h11>h12). Also, the width w2 of the slant surfaces 11a and 12a in the directions on the first axis can be designed to be smaller than the width w1 of the slant surfaces 15a and 16a in the directions on the first axis (w1>w2). This configuration can reduce the space under the floor of the vehicle 2 necessary for installation of the vehicle power conversion apparatus 1a, thereby achieving a greater variety of installation manners.

The above-described embodiments should not be construed as limiting the disclosure and may be modified and simplified as required without departing from the scope of the idea of the disclosure.

REFERENCE SIGNS LIST 1, 1a Vehicle power conversion apparatus
2 Vehicle
3 Housing
4 Semiconductor element
5 Cooler
6 Position adjusting member
10 Fastener
11a Slant surface
37 Bottom surface
51, 55 Heat receiver
51a, 55a Heated surface
51c Outer peripheral surface
52, 56 Heat radiator
52a, 56a Radiating fin
55c Lower surface
61 Space
63 First water stopper
65 Second water stopper
66 Outer peripheral surface

The invention claimed is:

1. A vehicle power conversion apparatus comprising:
a housing to be attached to a vehicle;
a cooler comprising:
a heat receiver disposed on a side near the housing, the heat receiver comprising a heated surface provided with a semiconductor element; and
a heat radiator disposed on a surface of the heat receiver opposite to the heated surface; and
a position adjusting member to adjust a position of an end of the heat radiator distant from the housing in a direction approaching a rigging limit of the vehicle,
wherein the position adjusting member is disposed between the housing and the heat receiver,
wherein the position adjusting member is provided with a water stopper on one of a housing-side surface of the position adjusting member and a heat receiver-side surface of the position adjusting member, the water stopper being configured to prevent fluid from entering inside through a gap between the position adjusting member and the housing or a gap between the position adjusting member and the heat receiver.

2. The vehicle power conversion apparatus according to claim 1, wherein the position adjusting member has a space for accommodating the semiconductor element therein.

3. The vehicle power conversion apparatus according to claim 2, wherein the position adjusting member is integrally formed into a rectangular frame shape.

4. The vehicle power conversion apparatus according to claim 3, wherein the position adjusting member comprises an outer peripheral surface disposed to be flush with an outer peripheral surface of the heat receiver.

5. The vehicle power conversion apparatus according to claim 2, wherein the position adjusting member comprises an outer peripheral surface disposed to be flush with an outer peripheral surface of the heat receiver.

6. The vehicle power conversion apparatus according to claim 2, wherein the position adjusting member is provided with a water stopper on the other of the housing-side surface of the position adjusting member and the heat receiver-side surface of the position adjusting member, the water stoppers being configured to prevent fluid from entering inside through the gap between the position adjusting member and the housing and the gap between the position adjusting member and the heat receiver.

7. The vehicle power conversion apparatus according to claim 1, wherein the position adjusting member is integrally formed into a rectangular frame shape.

8. The vehicle power conversion apparatus according to claim 7, wherein the position adjusting member comprises an outer peripheral surface disposed to be flush with an outer peripheral surface of the heat receiver.

9. The vehicle power conversion apparatus according to claim 7, wherein the position adjusting member is provided with a water stopper on the other of the housing-side surface of the position adjusting member and the heat receiver-side surface of the position adjusting member, the water stoppers being configured to prevent fluid from entering inside through the gap between the position adjusting member and the housing and the gap between the position adjusting member and the heat receiver.

10. The vehicle power conversion apparatus according to claim 1, wherein the position adjusting member comprises an outer peripheral surface disposed to be flush with an outer peripheral surface of the heat receiver.

11. The vehicle power conversion apparatus according to claim 1, wherein the position adjusting member is provided with a water stopper on the other of the housing-side surface of the position adjusting member and the heat receiver-side surface of the position adjusting member, the water stoppers being configured to prevent fluid from entering inside through the gap between the position adjusting member and the housing and the gap between the position adjusting member and the heat receiver.

12. The vehicle power conversion apparatus according to claim 11, wherein the water stoppers are disposed at positions opposite to each other on the housing-side surface of the position adjusting member and the heat receiver-side surface of the position adjusting member.

13. The vehicle power conversion apparatus according to claim 1, further comprising:
fasteners to fix the heat receiver and the position adjusting member together to the housing.

14. The vehicle power conversion apparatus according to claim 1, wherein
the heat radiator is disposed below the housing, and
the position adjusting member is disposed such that the end of the heat radiator is located above the rigging limit defined under the vehicle.

15. The vehicle power conversion apparatus according to claim 1, wherein
the housing comprises a bottom surface located higher than an upper end of a slant surface included in the vehicle, the slant surface being inclined downward in a direction away from the heat radiator with respect to a traveling direction of the vehicle so as to introduce a traveling wind to the heat radiator, and
the heat receiver comprises a lower surface located on a side opposite to the heated surface, the lower surface being located at a same height or lower than the upper end of the slant surface.

16. The vehicle power conversion apparatus according to claim 1, wherein the semiconductor element is made as a wide bandgap semiconductor.

* * * * *